US011011587B2

(12) United States Patent
Lee et al.

(10) Patent No.: US 11,011,587 B2
(45) Date of Patent: May 18, 2021

(54) DISPLAY APPARATUS

(71) Applicant: Samsung Display Co., Ltd., Yongin-si (KR)

(72) Inventors: Minsu Lee, Yongin-si (KR); Jongbaek Seon, Yongin-si (KR); Juncheol Shin, Yongin-si (KR); Jieun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/813,440

(22) Filed: Mar. 9, 2020

(65) Prior Publication Data

US 2020/0388653 A1 Dec. 10, 2020

(30) Foreign Application Priority Data

Jun. 5, 2019 (KR) .................. 10-2019-0066876

(51) Int. Cl.
*H01L 27/32* (2006.01)
*G06F 3/041* (2006.01)
(Continued)

(52) U.S. Cl.
CPC ........... *H01L 27/322* (2013.01); *G06F 3/044* (2013.01); *G06F 3/0412* (2013.01);
(Continued)

(58) Field of Classification Search
USPC ...................................................... 345/174
See application file for complete search history.

(56) References Cited

U.S. PATENT DOCUMENTS 7,615,800 B2 11/2009 Kahen
10,359,663 B2 7/2019 Lee et al.
(Continued)

FOREIGN PATENT DOCUMENTS

KR 10-2008-0043829 A 5/2008
KR 10-2017-0041951 A 4/2017
(Continued)

OTHER PUBLICATIONS

Chen, Yeechi et al., "Excitation enhancement of CdSe quantam dots by single metal nanoparticles", Applied Physics Letters 93, 053106, 2008, 4pp.

*Primary Examiner* — Chineyere D Wills-Burns
(74) *Attorney, Agent, or Firm* — Lewis Roca Rothgerber Christie LLP

(57) ABSTRACT

A display apparatus includes: a first pixel, a second pixel, and a third pixel respectively configured to emit different colors; a first quantum transformation layer arranged to correspond to an emission area of the first pixel, the first quantum transformation layer including first quantum dots and first metal nanoparticles; and a second quantum transformation layer arranged to correspond to an emission area of the second pixel, the second quantum transformation layer including second quantum dots and second metal nanoparticles, wherein an average size of the first quantum dots is different from an average size of the second quantum dots, and wherein an average size of the first metal nanoparticles is identical to an average size of the second metal nanoparticles.

20 Claims, 13 Drawing Sheets

(51) Int. Cl.
    *G06F 3/044*     (2006.01)
    *G09G 3/20*     (2006.01)
    *H01L 51/52*     (2006.01)
    *G09G 3/3225*     (2016.01)
    *G02B 5/20*     (2006.01)

(52) U.S. Cl.
    CPC ......... *G09G 3/2003* (2013.01); *G09G 3/3225* (2013.01); *H01L 51/5253* (2013.01); *G02B 5/201* (2013.01); *G09G 2300/0452* (2013.01)

(56) References Cited

U.S. PATENT DOCUMENTS

| | | | | |
|---|---|---|---|---|
| 2007/0230233 | A1* | 10/2007 | Takahashi | G11B 11/00 365/145 |
| 2014/0008618 | A1* | 1/2014 | Lim | H01L 27/3246 257/40 |
| 2015/0285969 | A1* | 10/2015 | Kim | G02B 5/201 359/891 |
| 2015/0293280 | A1* | 10/2015 | Lee | G02F 1/133514 359/891 |
| 2016/0170537 | A1* | 6/2016 | Chen | G06F 3/0412 345/173 |
| 2017/0102487 | A1* | 4/2017 | Lee | G03F 7/2053 |
| 2017/0176816 | A1* | 6/2017 | Han | G03F 7/0007 |
| 2018/0100956 | A1* | 4/2018 | Lee | G02B 5/3058 |
| 2018/0231843 | A1 | 8/2018 | Park et al. | |
| 2019/0067639 | A1* | 2/2019 | Jiang | H01L 51/5256 |
| 2020/0292488 | A1* | 9/2020 | Lim | B01J 20/28066 |
| 2021/0013370 | A1* | 1/2021 | Yan | H01L 33/06 |

FOREIGN PATENT DOCUMENTS

| | | |
|---|---|---|
| KR | 10-2017-0091406 A | 8/2017 |
| KR | 10-1784085 B1 | 11/2017 |
| KR | 10-2018-0040173 A | 4/2018 |
| KR | 10-2018-0094200 A | 8/2018 |

* cited by examiner

DISPLAY APPARATUS

CROSS-REFERENCE TO RELATED APPLICATION

This application claims priority to and the benefit of Korean Patent Application No. 10-2019-0066876, filed on Jun. 5, 2019, in the Korean Intellectual Property Office, the entire content of which is incorporated herein by reference.

BACKGROUND

1. Field

One or more embodiments of the present disclosure relate to a display apparatus.

2. Description of Related Art

A display apparatus is an apparatus that visually expresses data (e.g., by displaying an image). The display apparatus includes a substrate that includes a display area and a peripheral area. The display area includes scan lines and data lines which are insulated from each other, and a plurality of pixels. In addition, a thin-film transistor and a pixel electrode electrically coupled to the thin-film transistor, which correspond to each of the plurality of pixels, are provided in the display area. Furthermore, an opposite electrode that is commonly provided in the pixels may be provided in the display area. The peripheral area may include various suitable lines for delivering electrical signals to the display area, a scan driver, a data driver, a controller, a pad unit, and/or the like.

The usage of such display apparatuses has diversified. Accordingly, various designs for improving the quality of display apparatuses have been made.

SUMMARY

One or more embodiments relate to a display apparatus in which a high quality image is realized in a display area. However, the objective is only exemplary and the scope of the embodiments is not limited thereto.

Additional aspects of embodiments will be set forth in part in the description which follows and, in part, will be apparent from the description, or may be learned by the practice of the presented embodiments.

According to one or more embodiments, a display apparatus including a first pixel, a second pixel, and a third pixel respectively configured to emit different colors includes: a first quantum transformation layer arranged to correspond to an emission area of the first pixel, the first quantum transformation layer including first quantum dots and first metal nanoparticles; and a second quantum transformation layer arranged to correspond to an emission area of the second pixel, the second quantum transformation layer including second quantum dots and second metal nanoparticles, wherein the first quantum dots have sizes in a range that is different from a range of sizes of the second quantum dots, and wherein the first metal nanoparticles have sizes in a range that is identical to a range of sizes of the second metal nanoparticles.

In an embodiment, the display apparatus further includes a first color filter arranged to correspond to the first pixel, a second color filter arranged to correspond to the second pixel, and a third color filter arranged to correspond to the third pixel, wherein the first color filter, the second color filter, and the third color filter may be respectively configured to filter colors that are different from each other.

In an embodiment, the display apparatus may further include an upper substrate arranged to correspond to the substrate, wherein the upper substrate includes a polarization layer.

In an embodiment, the display apparatus may further include: a thin-film encapsulation layer covering the first pixel, the second pixel, and the third pixel, the thin film encapsulation layer including at least one inorganic encapsulation layer and at least one organic encapsulation layer; and a touch-screen layer on the thin film encapsulation layer.

In an embodiment, the first pixel may be configured to emit a color having a wavelength longer than a wavelength of a color emitted by the second pixel, and an average size of the first quantum dots may be greater than an average size of the second quantum dots.

In an embodiment, the first metal nanoparticles and the second metal nanoparticles may be curved and do not have angles.

In an embodiment, the first metal nanoparticles and the first quantum dots may be spaced apart from one another, and the second metal nanoparticles and the second quantum dots may be spaced apart from one another.

In an embodiment, graft molecules may be on surfaces of the first metal nanoparticles and on surfaces of the second metal nanoparticles.

In an embodiment, the first metal nanoparticles and the second metal nanoparticles may include one (or more) selected from Au, Ag, Al, alumina ($Al_2O_3$), Co, Cu, Cr, Pt, Ni, Fe, Mo, and W.

In an embodiment, respective radiuses of the first metal nanoparticles and the second nanoparticles may be in a range from about 20 nm to about 40 nm.

In an embodiment, the display apparatus includes a third quantum dot transformation layer arranged to correspond to the third pixel, the third quantum transformation layer including third quantum dots and third metal nanoparticles, wherein an average size of the third quantum dots may be different from an average size of the first quantum dots and an average size of the second quantum dots, and wherein the average size of the third metal nanoparticles may be identical to an average size of the first metal nanoparticles and an average size of the second metal nanoparticles.

In an embodiment, the first pixel, the second pixel, and the third pixel may respectively include organic light emitting diodes.

In an embodiment, the organic light-emitting diode included in the first pixel, the second pixel, and the third pixel may all be configured to emit blue light.

According to one or more embodiments, a display apparatus includes: a first pixel, a second pixel, and a third pixel on a substrate each including an organic light-emitting diode configured to emit blue light; a thin-film encapsulation layer covering the organic light-emitting diode; and a first quantum transformation layer on the thin film encapsulation layer and corresponding to the first pixel, a second quantum transformation layer corresponding to the second pixel, and a transmission window corresponding to the third pixel, wherein the first quantum transformation layer includes first quantum dots and first metal nanoparticles, and wherein the second quantum transformation layer includes second quantum dots having an average size different from an average size of the first quantum dots and second metal nanoparticles having an average size that is identical to an average size of the first metal nanoparticles.

In an embodiment, the organic light-emitting diodes included in the first pixel, the second pixel, and the third pixel may be configured to emit blue light.

In an embodiment, the thin film encapsulation layer may include at least one inorganic encapsulation layer and at least one organic encapsulation layer.

In an embodiment, the first metal nanoparticles and the second nanoparticles may include silver (Ag) and each have a radius in a range from about 20 nm to about 20 nm.

In an embodiment, wherein the transmission window includes scattering particles.

In an embodiment, a touch conductive layer may be on the thin film encapsulation layer.

In an embodiment, the display apparatus may further include a first color filter arranged to correspond to the first quantum transformation layer; a second color filter arranged to correspond to the second quantum transformation layer; and a third color filter arranged to correspond to the transmission window.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
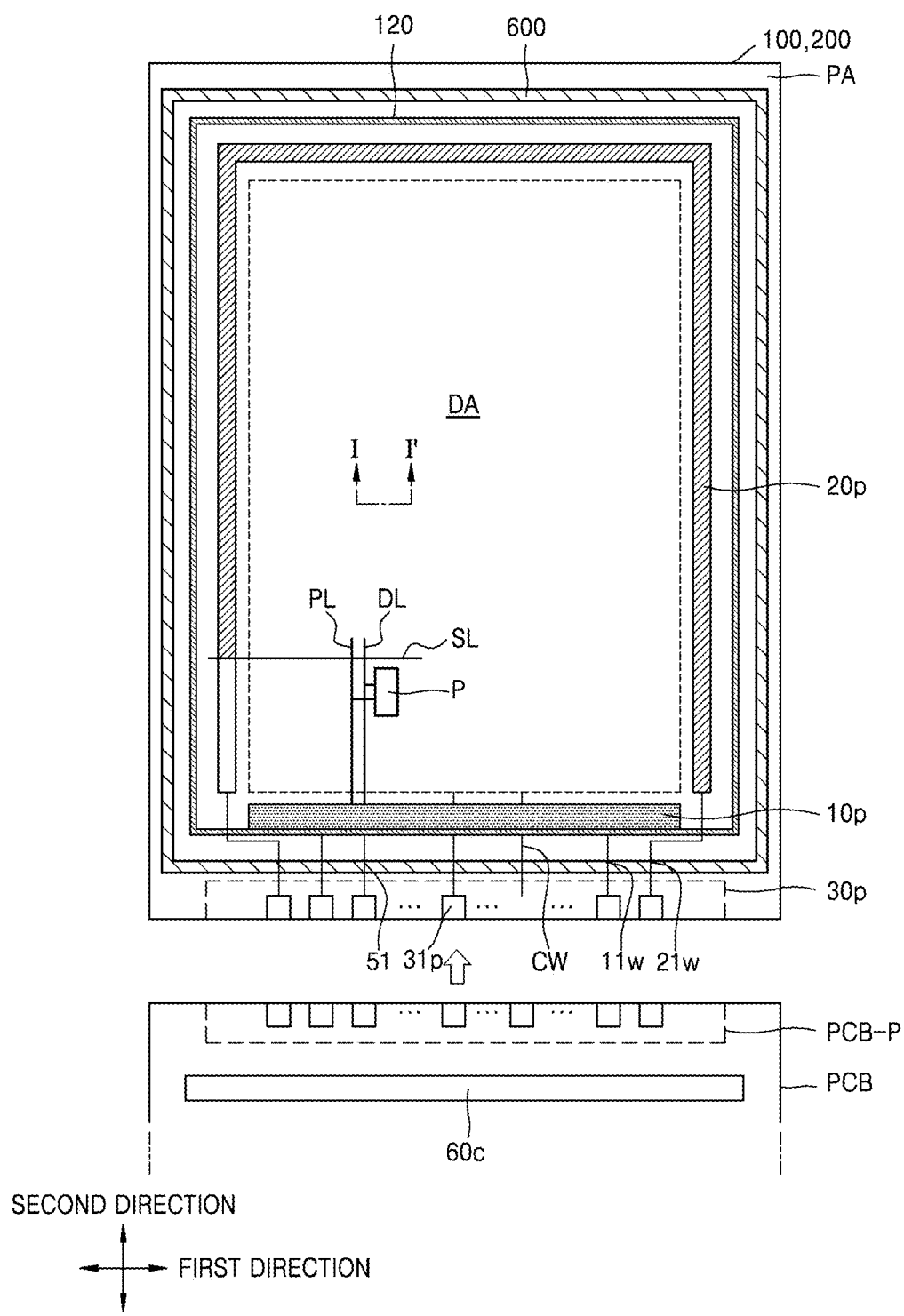
FIG. 1 is a schematic top-plan view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described herein below, by referring to the figures, to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the embodiments will be described more fully with reference to the accompanying drawings. Like reference numerals denote like or corresponding elements, and thus, their description will not be repeated.

In embodiments set forth herein, terms such as "first," "second," and so on are used to distinguish one component from another, and are not intended to limit the components.

In the embodiments, an expression used in the singular encompasses the expression of the plural, unless it has a clearly different meaning in the context.

In the embodiments, terms such as "including," and "having" are intended to indicate the existence of the features or components thereof disclosed in the specification, and are not intended to preclude the possibility that one or more other features or components may exist or may be added.

In the embodiments, when a layer, a region, or a component and the like are referred to as being "on" another layer, region, or component, the layer, region, or the component may be directly on the other layer, region, component or an intervening layer, region, component may be present therebetween.

Sizes of components in the drawings may be exaggerated for convenience of explanation. In other words, because sizes and thicknesses of components in the drawings may be arbitrarily illustrated for convenience of explanation, the following embodiments are not limited thereto.

In following embodiments, when a layer, region, or component is coupled to another layer, region, or component, the layer, region, or component may be directly coupled to the other layer, region, or component, and may be indirectly coupled to the other layer, region, or component having another layer, region, or component therebetween. For example, in the present specification, when a layer, region, or component is electrically coupled to another layer, region, or component, the layer, region, or component may be electrically coupled in a direct manner to the other layer, region, or component, and electrically coupled in an indirect manner to the other layer, region, or component having another layer, region, or component therebetween.

A display apparatus, which is an apparatus for displaying an image, may include an organic light-emitting display apparatus, an inorganic light-emitting display apparatus, a quantum dot light-emitting display apparatus, a field emission display apparatus, a surface-conduction electron-emitter display apparatus, a plasma display apparatus, and the like.

Hereinafter, an organic light-emitting display apparatus is explained as an example of a display apparatus according to an embodiment, but the display apparatus of the present disclosure is not limited thereto and may include various suitable types (or kinds) of display apparatuses.

FIG. 1 is a schematic top-plan view of a display apparatus according to an embodiment.

Referring to FIG. 1, the display apparatus may be formed by bonding a substrate 100 and an upper substrate 200 to each other by using a sealing member 600. The sealing member 600 may be formed to surround perimeter surfaces of the substrate 100 and the upper substrate 200 to bond the substrate 100 and the upper substrate 200 to each other.

The display apparatus includes a display area DA and a peripheral area PA arranged around the display area DA. The display apparatus may provide an image by using light emitted through a plurality of pixels included in the display area DA.

The display area DA includes pixels P coupled to a data line DL extending in a first direction and a scan line SL extending in a second direction that intersects with the first direction. The pixels P are also each coupled to a driving voltage line PL extending in the first direction.

The pixels P may each include a display device such as an organic light-emitting diode OLED. The pixels P may each emit, for example, red, green, blue, or white light through the organic light-emitting diode OLED. The pixel P in the present specification may be understood as a sub-pixel that emits light having a color selected from among red, green, blue, and white. In some embodiments, organic light-emitting diodes OLEDs included in the pixels P all emit light of a same (e.g., substantially the same) color, and color of each pixel P may be realized by color filters and the like on (e.g., arranged on) the organic light-emitting diode.

The pixels P may each be electrically coupled to embedded circuits arranged in the peripheral area PA. A first power supply line 10p, a second power supply line 20p, and a pad unit 30p may be in the peripheral area PA.

The first power supply line 10p may correspond to a side of the display area DA. The first power supply line 10p may be coupled to a plurality of driving voltage lines PL that deliver a driving voltage ELVDD (refer to FIGS. 2A and 2B, which are described herein below) to the pixels P.

The second power supply line 20p may have the form of a loop, in which a side is open, and partially surround the display area DA. The second power supply line 20p may supply a common voltage to an opposite electrode of the pixel P. The second power supply line 20p may be referred to as a common voltage supply line.

The pad unit 30p may include a plurality of pads 31p (and be arranged at one side of a substrate 100). The pads 31p may be respectively coupled to a first connection line 11w that is coupled to the first power supply line 10p, connection lines CW extending to the display area DA, or the like. The plurality of pads 31p of the pad unit 30p may not be covered by an insulating layer and may be exposed to be electrically coupled to a printed circuit board PCB. A PCB terminal portion PCB-P of the printed circuit board PCB may be electrically coupled to the pad unit 30p.

The printed circuit board PCB delivers power or a signal of a controller or power to the pad unit 30p. The controller may, through the first connection line 11w and the second connection line 21w, provide the driving voltage ELVDD and the common voltage ELVSS (refer to the FIGS. 2A and 2B, which are described herein below) respectively to the first power supply line 10p and the second power supply line 20p.

A data driving circuit 60c is electrically coupled to the data line DL. A data signal of the data driving circuit 60c may be provided to each of the pixels P through the connection line CW coupled to the pad unit 30p and the data line DL coupled to the connection line CW. In FIG. 1, the data driving circuit 60c is arranged in the printed circuit board PCB. However, as another embodiment, the data driving circuit 60c may be on (e.g., arranged on) the substrate 100. For example, the data driving circuit 60c may be between the pad unit 30p and the first power supply line 10p.

A dam unit 120 may be arranged in the peripheral area PA. The dam unit 120 may prevent or reduce flow of an organic material toward an edge of the substrate 100 when forming an organic encapsulation layer 420 (see FIG. 10) of a thin film encapsulation layer 400 to thereby prevent or reduce formation of an edge tail of the organic encapsulation layer 420. The dam unit 120 may be arranged in the peripheral area PA to surround at least a portion of the display area DA. The dam unit 120 may be configured to include a plurality of dams, and when the plurality of dams are arranged, the dams may be spaced apart from one another. The dam unit 120 may be, in the peripheral area PA, arranged nearer to the display area DA than a sealing member 600. In some embodiments, an embedded driving circuit unit that provides a scan signal to each pixel P may be further provided in the peripheral area PA. In some embodiments, the embedded driving circuit unit and the dam unit 120 may overlap each other.

Figure 2A:
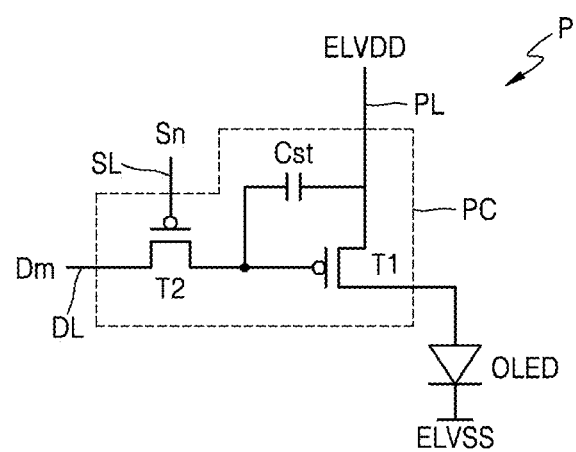
FIG. 2A is an equivalent circuit diagram of a pixel which may be provided in the display apparatus shown in FIG. 1 according to an embodiment.
Figure 2B:
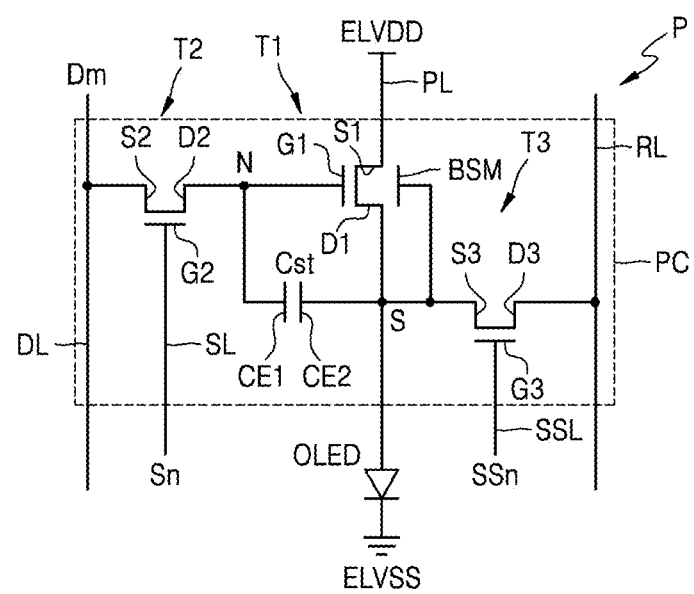
FIG. 2B is an equivalent circuit diagram of a pixel which may be provided in the display apparatus of FIG. 1 according to another embodiment.

FIGS. 2A and 2B are equivalent circuit diagrams of a pixel P of the display apparatus according to an embodiment.

Referring to FIG. 2A, each pixel P includes a pixel circuit PC, which is coupled to the scan line SL and the data line DL, and an organic light-emitting diode OLED coupled to the pixel circuit PC.

The pixel circuit PC includes a driving thin-film transistor T1, a switching thin-film transistor T2, and a storage capacitor Cst. The switching thin-film transistor T2, which is coupled to the scan line SL and the data line DL, delivers a data signal Dm input through the data line DL to the driving thin-film transistor T1 in response to a scan signal Sn that is input through the scan line SL.

The storage capacitor Cst, which is coupled to the switching thin-film transistor T2 and the driving voltage line PL, stores a voltage corresponding to a difference between a voltage received from the switching thin-film transistor T2 and the first power voltage ELVDD (or the driving voltage) provided to the driving voltage line PL).

The driving thin-film transistor T1, which is coupled to the driving voltage line PL and the storage capacitor Cst, may control a driving current flowing from the driving voltage line PL through the organic light-emitting diode OLED to correspond to a value of the voltage stored in the storage capacitor Cst. The organic light-emitting diode OLED may emit light having a certain luminance in response to the driving current.

FIG. 2A shows a case in which the pixel circuit PC includes two thin-film transistors and one storage capacitor, but the present disclosure is not limited thereto.

Referring to FIG. 2B, the pixels P may each include the organic light-emitting diode OLED and a pixel circuit PC that includes a plurality of thin-film transistors for driving the organic light-emitting diode OLED. The pixel circuit PC may include the driving thin-film transistor T1, the switching thin-film transistor T2, a sensing thin-film transistor T3, and the storage capacitor Cst.

The scan line SL may be in contact (e.g., electrical or physical contact) with a gate electrode G2 of the switching thin-film transistor T2; the data line DL may be in contact (e.g., electrical or physical contact) with a source electrode S2; and a first electrode CE1 of the storage capacitor Cst may be in contact (e.g., electrical or physical contact) with a drain electrode D2.

Therefore, the switching thin-film transistor T2 provides a data voltage of the data line DL to a first node N in response to the scan signal Sn from the scan line SL of each pixel P.

A gate electrode G1 of the driving thin-film transistor T1 may be in contact (e.g., electrical or physical contact) with the first node N; a source electrode S1 may be in contact (e.g., electrical or physical contact) with the driving voltage line PL that delivers the driving voltage ELVDD; and a drain electrode D1 may be in contact (e.g., electrical or physical contact) with an anode electrode of the organic light-emitting diode OLED.

Accordingly, the driving thin-film transistor T1 may adjust an amount of current flowing through the organic light-emitting diode OLED according to a source-gate voltage Vgs of the driving thin-film transistor T1 such as, for example, a voltage applied between the driving voltage ELVDD and the first node N.

A sensing control line SSL is in contact (e.g., electrical or physical contact) with a gate electrode G3 of the sensing thin-film transistor T3; a source electrode S3 is in contact (e.g., electrical or physical contact) with a second node S; and a drain electrode D3 is in contact (e.g., electrical or physical contact) with a reference voltage line RL. In some embodiments, the sensing thin-film transistor T3 may be controlled by the scan line SL instead of the sensing control line SSL.

The sensing thin-film transistor T3 may sense an electric potential of the pixel electrode (for example, the anode electrode) of the organic light-emitting diode OLED. The sensing thin film transistor T3, in response to a sensing signal SSn from the sensing control line SSL, provides a pre-charging voltage from the reference voltage line RL to the second node S or provides a voltage of the pixel electrode (for example, the anode electrode) of the organic light-emitting diode OLED for a sensing period to the reference voltage line RL.

The first electrode CE1 of the storage capacitor Cst is in contact (e.g., electrical or physical contact) with the first node N1 and a second electrode CE2 of the storage capacitor Cst is in contact (e.g., electrical or physical contact) with the second node S. The storage capacitor Cst charges a difference voltage between the voltages respectively provided to the first node N and the second node S to provide the charged difference voltage as a driving voltage of the driving thin-film transistor T1. For example, the storage capacitor Cst may charge a difference voltage between a data voltage Dm and a precharging voltage Vpre respectively provided to the first node N and the second node S.

A bias electrode BSM may be formed to correspond to the driving thin-film transistor T1 and be in contact (e.g., electrical or physical contact) with the source electrode S3 of the sensing thin-film transistor T3. As the bias electrode BSM receives a voltage in connection with an electric potential of the source electrode S3 of the sensing thin-film transistor T3, the driving thin-film transistor T1 may be stabilized. In some embodiments, the bias electrode BSM may be in contact (e.g., electrical or physical contact) with another bias line without being in contact (e.g., electrical or physical contact) with the source electrode S3 of the sensing thin-film transistor T3.

The opposite electrode (for example, a cathode electrode) of the organic light-emitting diode OLED receives the common voltage ELVSS. The organic light-emitting diode OLED receives the driving current from the driving thin-film transistor T1 and emits light.

FIG. 2B shows a case in which the signal lines SL, SSL, DL, the reference voltage line RL, and the driving voltage line PL are provided in each pixel P, but the present disclosure is not limited thereto. For example, at least one selected from the signal lines SL, SSL, and DL and/or the reference voltage line RL and the driving voltage line PL may be shared by neighboring pixels.

The pixel circuit PC is not limited to the numbers and circuit designs of the thin-film transistors and the storage capacitor Cst described with reference to FIGS. 2A and 2B, and the numbers and the circuit designs may be variously modified.

Figure 3:
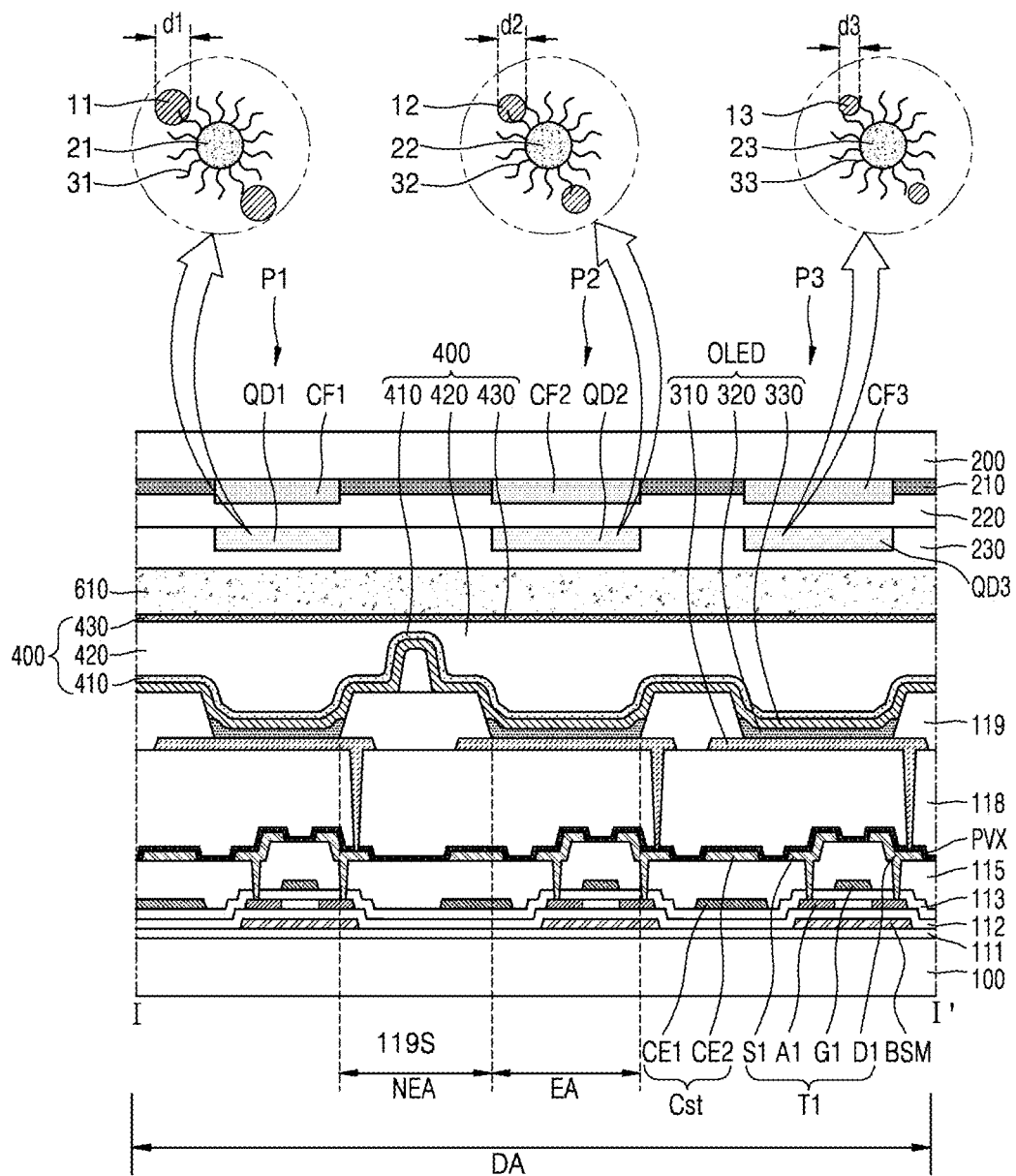
FIG. 3 is a schematic cross-sectional view of a display apparatus according to an embodiment.
Figure 4:
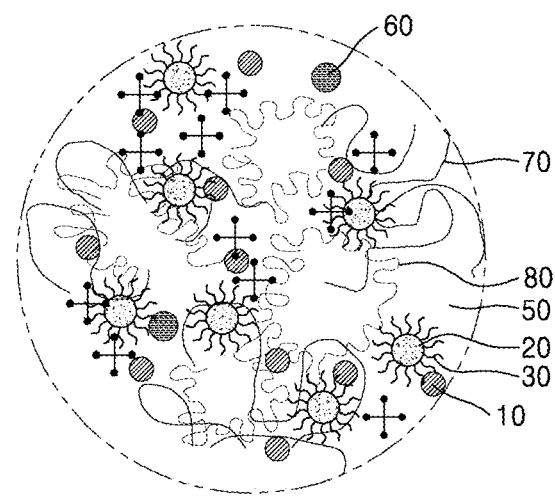
FIG. 4 is a schematic diagram of a configuration that may be included in a quantum transformation layer of an embodiment.

FIG. 3, which is a cross-sectional view of a portion of the display area DA of the display apparatus according to embodiments, may correspond to line I-I' shown in FIG. 1. FIG. 4 is an extended view of configurations included in the quantum transformation layers shown FIG. 3.

Referring to FIG. 3, at least one thin-film transistor (e.g., the driving thin-film transistor T1) and a display device coupled to the thin-film transistor may be arranged in the display area DA of the display apparatus according to an embodiment.

In the present embodiment, the display area DA of the display apparatus includes a plurality of pixels (e.g., a first pixel P1, a second pixel P2, and a third pixel P3), and each of the pixels (e.g., the first pixel P1, the second pixel P2, and the third pixel P3) includes an emission area EA. The emission area EA may be an area in which light is generated and irradiated to outside. A non-emission area NEA is arranged between the emission areas EA, and the emission area EA of each of the pixels (e.g., the first pixel P1, the second pixel P2, and the third pixel P3) may be distinguished by the non-emission area NEA.

The first pixel P1, the second pixel P2, and the third pixel P3 may respectively realize (e.g., be configured to emit) different lights (e.g., different colors of light). For example, the first pixel P1 may realize (e.g., emit) red light, the second pixel P2 may realize (e.g., emit) green light, and the third pixel P3 may realize (e.g., emit) blue light. Seen from the top, the emission area EA in each pixel P may have various suitable polygon or circle shapes and may have various suitable arrangements such as a stripe arrangement and Pentile arrangement.

The display apparatus according to the present embodiment may include a quantum transformation layer to correspond to at least one pixel. For example, as shown in FIG. 3, a first quantum transformation layer QD1 and a second quantum transformation layer QD2 may respectively correspond to the first pixel P1 and the second pixel P2.

The first quantum transformation layer QD1 may include a first quantum dot 11 and a first metal nanoparticle 21; and the second quantum transformation layer QD2 may include a second quantum dot 12 and a second metal nanoparticle 22. In some embodiments, graft molecules 31 and 32 may be provided at surfaces of the first metal nanoparticle 21 and the second metal nanoparticle 22.

In the present embodiments, the first quantum dot 11 and the second quantum dot 12 included in the first quantum transformation layer QD1 and the second quantum transformation layer QD2 may have different average sizes (e.g., average particle sizes), and average sizes (e.g., average particle sizes) of the first metal nanoparticle 21 and the second metal nanoparticle 22 may be identical to each other. Further details thereof are described herein below.

Figure 9:
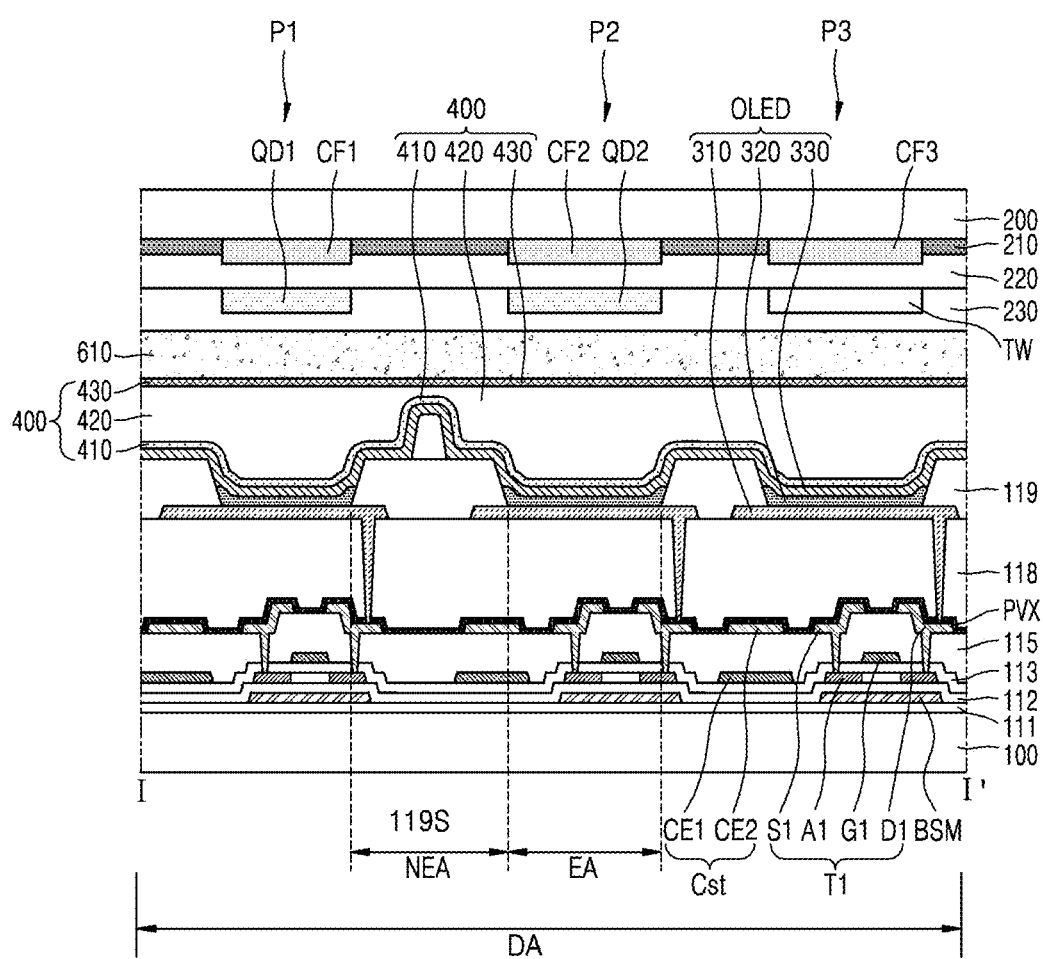
FIG. 9 is a schematic cross-sectional view of a display apparatus according to another embodiment.

In the case of FIG. 9, a transmission window TW may be arranged in an emission area EA of the third pixel P3 instead of a quantum transformation layer corresponding to the third pixel P3. The transmission window TW may include an organic material in which light emitted from the organic light-emitting diode OLED of the third pixel P3 may be emitted without change in a wavelength. In some embodiments, scattering particles may be distributed in the transmission window TW. As a result, color spreadability may be uniform (e.g., substantially uniform) or improved.

Organic light-emitting diodes OLEDs included in the first pixel P1, the second pixel P2, and the third pixel P3 may all emit light of a same (e.g., substantially the same) color. For example, the organic light-emitting diodes OLEDs may all emit blue light. Accordingly, the first metal nanoparticles 21 and the second metal nanoparticles 22 may be provided in a size having a greatest extinction property for blue light.

In some embodiments, the first quantum transformation layer QD1 may emit red light from the first quantum dots 11 and the second quantum transformation layer QD2 may emit green light from second quantum dots 12.

Figure 10:
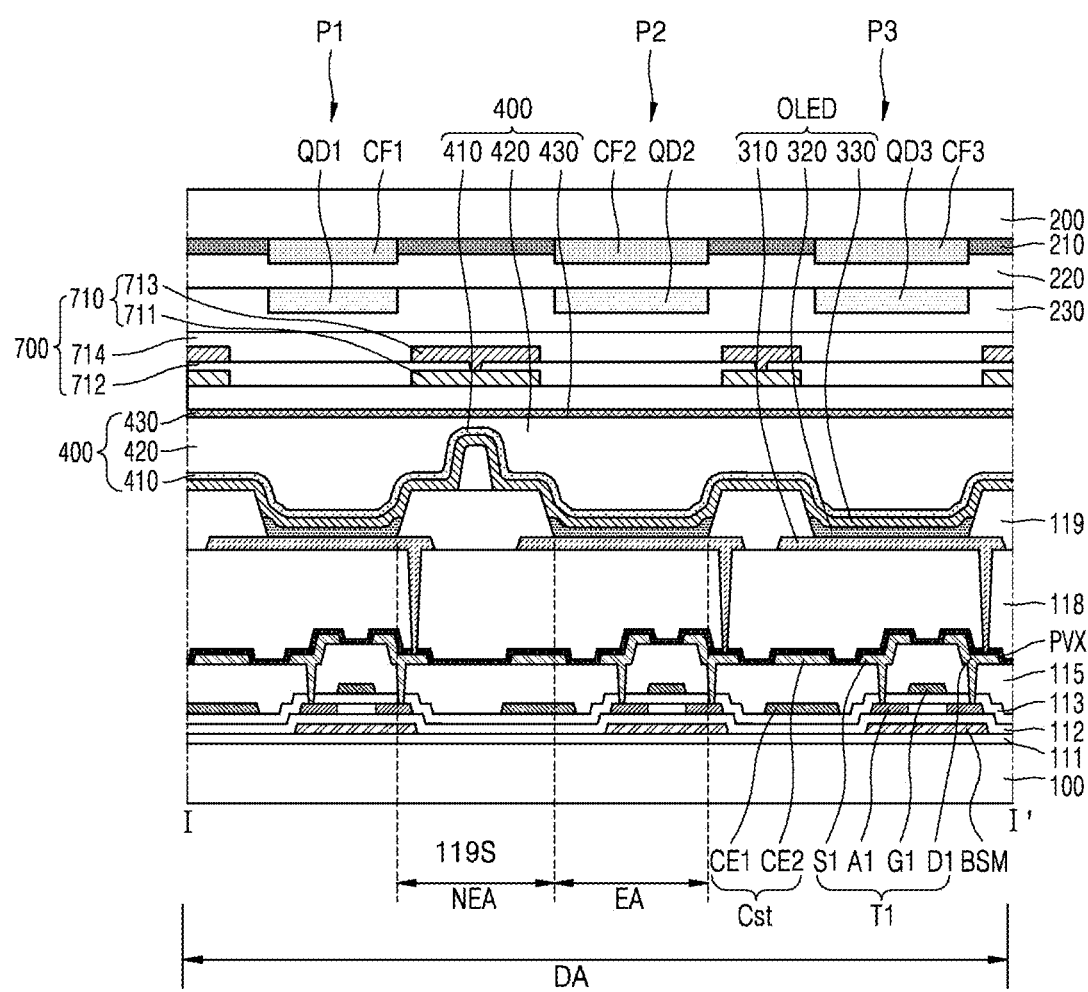
FIG. 10 is a schematic cross-sectional view of a display apparatus according to another embodiment.

In some embodiments, as shown in FIGS. 3 and 10, the display apparatus may include quantum transformation layers (e.g., the first quantum transformation layer QD1, the second quantum transformation layer QD2, and a third quantum transformation layer QD3) to respectively correspond to the emission areas EA of the first pixel P1, the second pixel P2, and the third pixel P3. The quantum transformation layers (e.g., the first quantum transformation layer QD1, the second quantum transformation layer QD2, and the third quantum transformation layer QD3) may each include quantum dots and metal nanoparticles.

For example, the quantum transformation layers (e.g., the first quantum transformation layer QD1, the second quantum transformation layer QD2, and the third quantum transformation layer QD3) may include: the first quantum transformation layer QD1 included in the first pixel P1; the second quantum transformation layer QD2 included in the second pixel P2; and the third quantum transformation layer Q3 included in the third pixel P3. The first quantum transformation layer QD1 may include the first quantum dots 11 and the first metal nanoparticles 21; and the second quantum transformation layer QD2 may include the second quantum dots 12 and the second metal nanoparticles 22. In addition, the third quantum transformation layer QD3 may include third quantum dots 13 and third metal nanoparticles 23. In some embodiments, the graft molecules 31, 32, and 33 may be provided at surfaces of the first metal nanoparticles 21, the second metal nanoparticles 22, and the third metal nanoparticles 23.

In the present embodiment, average sizes of the first quantum dot 11, the second quantum dot 12, and the third quantum dot 13, respectively, included in the quantum transformation layers (e.g., the first quantum transformation layer QD1, the second quantum transformation layer QD2, and the third quantum transformation layer QD3) may be different from one another, and average sizes (e.g., average particle sizes) of the first metal nanoparticle 21, the second metal nanoparticle 22, and the third metal nanoparticle 23 may be identical to one another. Further details thereof are described herein below.

Hereinafter, the display apparatus 1 according to an embodiment will be described in more detail according to a stacking order shown in FIG. 3.

The display area DA of FIG. 3 shows the driving thin-film transistor T1 and the storage capacitor Cst from among the pixel circuit PC of each pixel P described with reference to FIGS. 2A and 2B. For convenience of explanation, a configuration arranged in the display area DA of FIG. 3 is described according to a stacking order.

The substrate 100 may include glass material, ceramic material, metal material, and/or a flexible or bendable material. When the substrate 100 is flexible or bendable, the substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (P1), polycarbonate (PC), and/or cellulose acetate propionate (CAP). The substrate 100 may include a single layer or multiple layers including the above-mentioned materials, and in the case when the substrate 100 includes multiple layers, the substrate 100 may further include an inorganic layer. In some embodiments, the substrate 100 may include a structure of an organic material/an inorganic material/an organic material.

A barrier layer may be further included between the substrate 100 and a first buffer layer 111. The barrier layer may prevent, minimize, or reduce permeation of foreign materials from the substrate 100 and/or the like into a semiconductor layer A1. The barrier layer may include an inorganic material such as an oxide or a nitride, an organic material, or an organic-inorganic complex and include a single layer or multiple layers including an inorganic material and an organic material.

A bias electrode BSM may be on (e.g., arranged on) the first buffer layer 111 to correspond to the driving thin film transistor T1. A voltage may be applied to the bias electrode BSM. For example, the bias electrode BSM may be in contact (e.g., electrical or physical contact) with the source electrode S3 (see FIG. 2B) of the sensing thin-film transistor T3 (see FIG. 2B), and a voltage of the source electrode S3 may be applied to the bias electrode BSM. In addition, the bias electrode BSM may prevent foreign light from reaching the semiconductor layer A1 (or reduce an amount of foreign light that reaches the semiconductor layer). Accordingly, properties of the driving thin film transistor T1 may be stabilized. The bias electrode BSM may be omitted as needed or desired.

The semiconductor layer A1 may be on (e.g., arranged on) a second buffer layer 112. The semiconductor layer A1 may include amorphous silicon or polysilicon. As another embodiment, the semiconductor layer A1 may include an oxide of at least one material selected from among indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer A1, which is a Zn oxide-based material, may include Zn oxide, In—Zn oxide, Ga—In—Zn oxide, and/or the like. In another embodiment, the semiconductor layer A1 may include an In—Ga—Zn—O (IGZO) semiconductor, an In—Sn—Zn—O (ITZO) semiconductor, and/or an In—Ga—Sn—Zn—O (IGTZO) semiconductor, which includes a metal such as In, Ga, and Sn in addition to ZnO. The semiconductor layer A1 may include a channel area; the semiconductor layer A1 may further include a source area and a drain area arranged at two sides of the channel area. The semiconductor layer A1 may include a single layer or multiple layers.

The gate electrode G1 is on (e.g., arranged on) the semiconductor layer A1 to at least partially overlap the semiconductor layer A1 with a gate insulating layer 113 between the semiconductor layer A1 and the gate electrode G1. The gate electrode G1 may include molybdenum (Mo), aluminum (Al), copper (Cu), titanium (Ti) and/or the like and include a single layer or multiple layers. For example, the gate electrode G1 may include a single Mo layer. A first electrode CE1 of the storage capacitor Cst may be on (e.g., arranged on) a same layer as the gate electrode G1. The first electrode CE1 may include a same (e.g., substantially the same) material as the gate electrode G1.

An interlayer insulating layer 115 may be provided to cover the gate electrode G1 and the first electrode CE1 of the storage capacitor Cst. The interlayer insulating layer 115 may include silicon dioxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium dioxide ($HfO_2$), zinc peroxide ($ZnO_2$), and/or the like.

A second electrode CE2, the source electrode S1, the drain electrode D1, and the data line DL may be on (e.g., arranged on) the interlayer insulating layer 115.

The second electrode CE2 of the storage capacitor Cst, the source electrode S1, the drain electrode D1, and the data line DL may include a conductive material including Mo, Al, Cu, Ti, and/or the like and include multiple layers or a single layer including the above-mentioned materials. For example, the second electrode CE2, the source electrode S1, the drain electrode D1, and the data line DL may each include a multiple-layered structure of Ti/Al/Ti. The source electrode S1 and the drain electrode D1 may be in contact (e.g., electrical or physical contact) with the source area or the drain area of the semiconductor layer A1 via a contact hole.

The second electrode CE2 of the storage capacitor Cst overlaps the first electrode CE1 with the interlayer insulating layer 115 between the second electrode CE2 and the first electrode CE1 and forms a capacitance (e.g., exhibits capacitance). In this case, the interlayer insulating layer 115 may function as a dielectric layer of the storage capacitor Cst.

The second electrode CE2 of the storage capacitor Cst, the source electrode S1, the drain electrode D1, and the data line DL may be covered by an inorganic protection layer PVX.

The inorganic protection layer PVX may be a single layer or multiple layers including silicon nitride $SiN_x$ and/or silicon oxide $SiO_x$. The inorganic protection layer PVX may be adopted to cover and protect some lines on (e.g., arranged on) the interlayer insulating layer 115. Lines formed together in a same (e.g., substantially the same) process as that of the data line DL may be exposed in a portion (for example, a portion of a peripheral area) of the substrate 100. Exposed portions of the lines may be damaged by an etchant that is used during patterning of a pixel electrode 310, which is described in more detail herein below. As in the present embodiment, the inorganic protection layer PVX covers the data line DL and at least a portion of the lines formed together with the data line DL, and therefore, damage to the lines during the process of patterning the pixel electrode 310 may be prevented or reduced.

A planarization layer 118 may be on (e.g., arranged on) the inorganic protection layer PVX, and an organic light-emitting diode OLED may be on (e.g., arranged on) the planarization layer 118.

The planarization layer 118 may include a single layer or multiple layers including a film that includes an organic material. The planarization layer 118 provides a flat upper surface. The planarization layer 118 may include a general purpose polymer such as benzocyclobutene (BCB), polyimide, hexamethyldisiloxane (HMDSO), polymethylmethacrylate (PMMA), and/or polystyrene (PS), a polymer derivative having a phenolic group, an acryl-based polymer, an imide-based polymer, an arylether-based polymer, an amide-based polymer, a fluoride-based polymer, a p-xylene based polymer, a vinylalcohol-based polymer, a blend thereof, and/or the like.

In the display area DA of the substrate 100, the organic light-emitting diode OLED is on (e.g., arranged on) the planarization layer 118. The organic light-emitting diode OLED includes a pixel electrode 310, an intermediate layer 320 including an organic emission layer, and an opposite electrode 330.

The pixel electrode 310 may be a (semi)transmissive electrode or a reflective electrode. In some embodiments, the pixel electrode 310 may include a reflective layer including silver (Ag), magnesium (Mg), Al, platinum (Pt), palladium (Pd), gold (Au), nickel (Ni), neodymium (Nd), iridium (Ir), Cr, a compound thereof, and/or the like, and a transparent or translucent electrode layer on (e.g., arranged on) the reflective layer. The transparent or translucent electrode layer may include at least one selected from among indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 310 may include ITO/Ag/ITO.

A pixel defining layer 119 may be on (e.g., arranged on) the planarization layer 118. The pixel defining layer 119 defines pixels by having an opening corresponding to each sub-pixel such as, for example, a third opening that at least exposes a center portion of the pixel electrode 310. In addition, the pixel defining layer 119 may prevent an arc and/or the like from occurring (or reduced a likelihood or degree of the occurrence of such an arc and/or the like) at edges of the pixel electrode 310 by increasing distances between the edges of the pixel electrode 310 and the opposite electrode 330 above the pixel electrode 310.

The pixel defining layer 119, which includes one or more organic insulating materials selected from polyimide, polyamide, an acrylic resin, benzocyclobutene, and/or a phenolic resin, may be formed by a spin coating method and/or the like.

The intermediate layer 320 of the organic light-emitting diode OLED may include an organic emission layer. The organic emission layer may include an organic material that includes a fluorescent or phosphorescent material that emits red, green, blue, or white light. The organic emission layer may include a low molecular weight material or a high molecular weight material, and a functional layer such as a hole transport layer (HTL), a hole injection layer (HIL), an electron transport layer (ETL), and/or an electron injection layer (EIL) may be selectively further arranged below and above the organic emission layer. The intermediate layer 320 may be arranged to correspond to each of the plurality of pixel electrodes 310. However, the intermediate layer 320 is not limited thereto. The intermediate layer 320 may be variously modified; for example, the intermediate layer 320 may include an integral layer over the plurality of pixel electrodes 310.

Although FIG. 3 shows that the intermediate layer 320 is provided in each of the pixels (e.g., the first pixel P1, the second pixel P2, and the third pixel P3), the present disclosure is not limited thereto. The intermediate layer 320 may be integrally formed in the pixels (e.g., the first pixel P1, the second pixel P2, and the third pixel P3).

In the present embodiment, the organic light-emitting diodes OLEDs provided in the first pixel P1, the second pixel P2, and the third pixel P3 may include organic emission layers that all emit light of a same (e.g., substantially the same) color. For example, the organic light-emitting diodes OLEDs provided in the first pixel P1, the second pixel P2, and the third pixel P3 may all emit blue light.

The opposite electrode 330 may be a transmissive electrode or a reflective electrode. In some embodiments, the opposite electrode 330 may be a transparent or translucent electrode, and include a metal thin film, which has a small work function, including Li, calcium (Ca), LiF/Ca, LiF/Al, Al, Ag, Mg, and/or a compound thereof. In addition, a transparent conductive oxide film such as ITO, IZO, ZnO, and/or $In_2O_3$ may be further on (e.g., arranged on) the metal thin film. The opposite electrode 330 may be arranged over the display area DA and the peripheral area PA and on (e.g., arranged on) the intermediate layer 320 and the pixel defining layer 119. The opposite electrode 330 may be integrally formed in the plurality of organic light-emitting diodes OLEDs and correspond to the plurality of pixel electrodes 310.

A spacer 119S, which is a member for preventing a mask from being stamped (or for reducing a likelihood of the mask being stamped), may be further included on the pixel defining layer 119. The spacer 119S may be integrally formed with the pixel defining layer 119. For example, the spacer 119S and the pixel defining layer 119 may be concurrently (e.g., simultaneously) formed in a same (e.g., substantially the same) process, for example, a halftone mask process.

As the organic light-emitting diode OLED may be easily damaged due to external moisture or oxygen, the organic light emitting diode OLED may be protected by being covered with the thin film encapsulation layer 400. The thin film encapsulation layer 400 may cover the display area DA and extend to outside of the display area DA. The thin film encapsulation layer 400 includes at least one organic encapsulation layer and at least one inorganic encapsulation layer. For example, the thin film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include silicon oxide, silicon nitride, trioxide silicon nitride, and/or the like. In some embodiments, other layers such as a capping layer may be between the first inorganic encapsulation layer 410 and the opposite electrode 330 as needed. As the first inorganic encapsulation layer 410 is formed along a structure located thereunder, an upper surface of the first inorganic encapsulation layer 510 is not even. The organic encapsulation layer 420 covers the first inorganic encapsulation layer 410, and unlike the first inorganic encapsulation layer 410, an upper surface of the organic encapsulation layer 420 may be approximately even. For example, the upper surface of the organic encapsulation layer 420 may be approximately flat in a portion corresponding to the display area DA. The organic encapsulation layer 420 may include at least one material selected from among PET, PEN, PC, PI, PES, polyoxymethylene, PAR, and HDMSO. The second inorganic encapsulation layer 430 may cover the organic encapsulation layer and include silicon oxide, silicon nitride, trioxide silicon nitride, and/or the like.

According to a multiple-layered structure described herein above, even when cracks occur in the thin film encapsulation layer 400, the cracks may not be coupled between the first inorganic encapsulation layer 410 and the organic encapsulation layer 420 or between the organic encapsulation layer 420 and the second inorganic encapsulation layer 430. By doing so, formation of a path through which external moisture or oxygen permeates into the display area DA may be prevented, reduced, or minimized.

In the present embodiment, quantum transformation layers (e.g., the first quantum transformation layer QD1, the second quantum transformation layer QD2, and the third quantum transformation layer QD3) and a light blocking pattern 210 may be on (e.g., arranged on) an upper substrate 200 that is arranged to face the substrate 100.

The quantum transformation layers (e.g., the first quantum transformation layer QD1, the second quantum transformation layer QD2, and the third quantum transformation layer QD3) may include quantum dots and metal nanoparticles. Referring to FIG. 4, which shows an enlarged image of a portion of the quantum transformation layers (e.g., the first quantum transformation layer QD1, the second quantum transformation layer QD2, and the third quantum transformation layer QD3), the quantum transformation layers may include quantum dots 10 and metal nanoparticles 20. In the present embodiment, the quantum dot 10 may correspond to any one (or more) selected from the first quantum dot 11, the second quantum dot 12, and the third quantum dot 13, and the metal nanoparticle 20 may correspond to any one (or more) selected from the first metal nanoparticle 21, the second metal nanoparticle 22, and the third metal nanoparticle 23.

The quantum dots 10 have intrinsic excitation and emission properties according to textures and sizes of the quantum dots 10, and incident light may be transformed into light having a set or predetermined color according to the excitation and emission properties of the quantum dots 10. Various suitable materials may be employed as the quantum dots 10. For example, the quantum dots 10 may be selected from among a Group II-VI compound, a Group III-V compound, a Group IV-VI Compound, a Group IV element, a Group IV, and a combination thereof. The Group II-VI compound may be selected from among: a two-element compound selected from among CdSe, CdTe, ZnS, ZnSe, ZnTe, ZnO, HgS, HgSe, HgTe, MgSe, MgS, and a combination thereof; a three-element compound selected from among CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZns, and a combination thereof; and a four-element compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V may be selected from among: a two-element compound selected from GaN, GaP, GaAs, GaSb, AlN, AlP, AlAs, AlSb, InN, InP, InAs, InSb, and a combination thereof; a three-element compound selected from among GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof; and a four-element compound selected from among GaAlNAs, GaAlNSb, GaAlPAs, GaAlPSb, GaInNP, GaInAs, GaInNSb, GaInPAs, GaInPSb, InAlNP, InAlNAs, InAlNSb, InAlPAs, InAlPSb, and a combination thereof. The Group IV-VI compound may be selected from among: a two-element compound selected from among SnS, SnSe, SnTe, PbS, PbSe, PbTe, and a combination thereof; a three-element compound selected from SnSeS, SnSeTe, SnSTe, PbSeS, PbSeTe, PbSTe, SnPbS, SnPbSe, SnPbTe, and a combination thereof; and a four-element compound selected from among SnPbSSe, SnPbSeTe, SnPbSTe, and a combination thereof. The Group IV element may be selected from among Si, Ge, and a combination thereof. The Group IV may be two-element compound selected from among SiC, SiGe, and a combination thereof.

In this case, the two-element compound, the third-element compound, and the four-element compound may be in particles in uniform (e.g., substantially uniform) concentrations or be in a same particle in a state of being partially divided according to different concentrations. For example, the quantum transformation layers may include a particle including or consisting of the two-element compound, a particle including or consisting of the third-element compound, and a particle including or consisting the four-element compound, and/or the quantum transformation layers may include a particle including two or more selected from the two-element compound, the third-element compound, and the four-element compound.

The quantum dot 10 may also have a core-shell structure including a core and a shell. An interface between the core and the shell may have a concentration gradient in which a concentration of an element in the shell decreases toward a center of the quantum dot 10. The shell of the quantum dot 10 may function as a protective layer for preventing or reducing chemical change of the core and maintain properties of the semiconductor and/or a charging layer for giving an electrophoretic property to the quantum dot 10. The shell may include a single layer or multiple layers. The interface between the core and the shell may have a concentration gradient in which a concentration of an element in the shell decreases toward a center of the quantum dot 10. The shell in the quantum dot 10 may include, for example, an oxide of a metal or non-metal, a semiconductor compound, or a combination thereof.

For example, the oxide of metal or non-metal may include a two-element compound such as $SiO_2$, $Al_2O_3$, $TiO_2$, ZnO, MnO, $Mn_2O_3$, CuO, FeO, $Fe_2O_3$, $Fe_3O_4$, CoO, $Co_3O_4$, and/or NiO, and/or a three-element compound such as $MgAl_2O_4$, $CoFe_2O_4$, $NiFe_2O_4$, and/or $CoMn_2O_4$, but the present disclosure is not limited thereto.

The semiconductor compound may include, for example, Cds, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the present disclosure is not limited thereto.

The quantum dot 10 may emit light having a full width of half maximum (FWHM) of about 45 nm or less, about 40 nm or less, or, for example, about 30 nm or less, and a color purity or color gamut of the emitted light may be enhanced in the above-mentioned range. In addition, as light emitted from the quantum dot is irradiated in all directions, a field angle of the emitted light may be widened.

In addition, a shape of the quantum dot 10 is not particularly limited and may be any suitable shape generally used in the art for quantum dots. However, in some embodiments, the shape of quantum dot 10 may include a sphere, a pyramid shape, a multi-arm shape or a cubic-shape nanoparticle, nano tube, nano wire, nano fabric, nano laminar particle, and the like.

The core of the quantum dot 10 may have a diameter from about 2 nm to about 10 nm. As the quantum dot 10 exposed to light may emit light of a certain frequency according to sizes of particles and types (e.g., compositions) of materials, average sizes of the quantum dots 10 included in each of the quantum transformation layers (e.g., the first quantum transformation layer QD1, the second quantum transformation layer QD2, and the third quantum transformation layer QD3) may be different from one another. For example, the quantum dot 10 having a greater size may emit light of color having a longer wavelength. Therefore, the size of quantum dots 10 may be selected according to colors of the first pixel P1, the second pixel P2, and the third pixel P3.

The metal nanoparticles 20 are provided to amplify excitation and emission of the quantum dots 10. For example, the metal nanoparticle 20 may undergo polarization upon exposure to light. This polarization may be due to the extinction of the photons on a surface of the metal nanoparticle 20. A polarization distribution of the metal nanoparticles 20 depends on a material included in the metal nanoparticles 20, and depends on the shapes and sizes of the metal nanoparticles. For example, extinction of the photons increases at a certain wavelength of light. An increase in the extinction of the photons increases the excitation of electrons of the quantum dot 10 adjacent to the metal nanoparticle 20. As the amount or intensity of the excited electrons increases, emission by the quantum dot 10 also increases. The polarization may be understood as occurring due to a localized surface plasmon resonance of the metal nanoparticle 20.

The metal nanoparticle 20 may include one (or more) selected from Au, Ag, Al, $Al_2O_3$, Co, Cu, Cr, Pt, Ni, Fe, Mo, W, and the like.

The metal nanoparticle 20 may have a sphere shape (e.g., a generally spherical shape), but the shape of the metal nanoparticle 20 is not limited thereto. For example, the metal nanoparticle 20 may include curved figures without angles (e.g., without having a vertex at a surface thereof) such as, for example, an oval figure, or various suitable curved figures having a cross-section of a circle or an oval. A size of the metal nanoparticle 20 may be selected based on an appropriate or suitable value that is capable of increasing emission from the quantum dot 10.

The photon extinction property of the metal nanoparticle 20 may be expressed as an extinction cross-section $\sigma_{Ext}$ indicating a photon absorption rate per unit area. When it is assumed that the metal nanoparticle 20 is spherical, the photon extinction property is expressed according to the following equation (1).

$$\sigma_{Ext} = \sigma_{Abs} + \sigma_{Sca} \qquad (1)$$

$$\sigma_{Sca} = \frac{8\pi}{3} k^4 a^6 \left| \frac{\varepsilon - \varepsilon_m}{\varepsilon + 2\varepsilon_m} \right|$$

$$\sigma_{Abs} = 4\pi k a^3 \text{Im} \left| \frac{\varepsilon - \varepsilon_m}{\varepsilon + 2\varepsilon_m} \right|$$

Here, $\sigma_{Abs}$ and $\sigma_{Sca}$ respectively indicate an absorption cross-section and a scattering cross-section, k indicates $2\pi/\lambda$, $\lambda$ indicates a wavelength of light, a indicates a radius of the sphere (e.g., a radius of the nanoparticle 20), E indicates permittivity of the metal nanoparticle 20, and $\varepsilon_m$ indicates permittivity of a material around the metal nanoparticle 20.

From the equation described herein above, it can be seen that there is a suitable or optimum size representing an increased (e.g., a maximum) extinction property according to wavelengths of light incident on the metal nanoparticle 20.

The graft molecules 30 may be further formed at the surface of the metal nanoparticle 20. The graft molecule 30 may include an alkyl group (e.g., dodecane or a dodecanyl group). For example, the graft molecule 30 may include various suitable kinds of alkyl groups having a carbon number of 6 to 20 (e.g., a butyl group).

For example, the graft molecules 30 may include hexane ($C_6H_{14}$) (e.g., a hexyl group), heptane ($C_7H_{16}$) (e.g., a heptyl group), octane ($C_8H_{18}$) (e.g., an octyl group), nonane ($C_9H_{20}$) (e.g., a nonyl group), decane ($C_{10}H_{22}$) (e.g., a decanyl group), undecane ($C_{11}H_{24}$) (e.g., an undecanyl group), dodecane ($C_{12}H_{26}$) (e.g., a dodecanyl group), tridecane ($C_{13}H_{28}$) (e.g., a tridecanyl group), tetradecane ($C_{14}H_{30}$) (e.g., a tetradecanyl group), pentadecane ($C_{15}H_{32}$)

(e.g., a pentadecanyl group), hexadecane/cetane ($C_{16}H_{34}$) (e.g., a hexadecanyl group/cetanyl group), heptadecane ($C_{17}H_{36}$) (e.g., a heptadecanyl group), octadecane ($C_{18}H_{38}$) (e.g., an octadecanyl group), nonadecane ($C_{19}H_{40}$) (e.g., a nonadecanyl group), and/or icosane ($C_{20}H_{42}$) (e.g., an icosanyl group).

As a result of the presence of the graft molecules 30 on the surface of the metal nanoparticle 20, separation between the metal nanoparticles 20 or separation between the metal nanoparticle 20 and the quantum dot 10 may be realized or achieved. The metal nanoparticles 20 are provided in a plural number (e.g., in a plurality) and separated from one another.

It may be required that the metal nanoparticles 20 and the quantum dots 10 are apart from one another. When distances between the metal nanoparticle 20 and the quantum dot 10 is not maintained, emission due to the quantum dot 10 may be quenched by the metal nanoparticle 20. It may be required that an appropriate or suitable distance is maintained between the metal nanoparticle 20 and the quantum dot 10. For example, a distance between the metal nanoparticle 20 and the quantum dot 10 may be selected such that a resonance structure is formed between the metal nanoparticle 20 and the quantum dot 10.

The quantum transformation layer (e.g., the first quantum transformation layer QD1, the second quantum transformation layer QD2, and the third quantum transformation layer QD3) may further include, in addition to the quantum dot 10 and the metal nanoparticle 20 described herein above, various suitable materials for mixing and appropriately or suitably distributing the quantum dot 10 and the metal nanoparticles 20. For example, the quantum transformation layers (e.g., the first quantum transformation layer QD1, the second quantum transformation layer QD2, and the third quantum transformation layer QD3) may further include a solvent 50, a photoinitiator 60, a binder polymer 70, and a dispersing agent 80, but the present disclosure is not limited thereto.

In the present embodiment, the first quantum transformation layer QD1 provided in the first pixel P1 may include the first quantum dots 11 and the first metal nanoparticles 21; and the second quantum transformation layer QD2 provided in the second pixel P2 may include the second quantum dots 12 and the second metal nanoparticles 22. The third quantum transformation layer QD3 provided in the third pixel P3 may include the third quantum dots 13 and the third metal nanoparticles 23.

In the present embodiment, the organic light-emitting diodes OLEDs included in the pixels (e.g., the first pixel P1, the second pixel P2, and the third pixel P3) may all emit light having a same (e.g., substantially the same) wavelength, and colors of the pixels (e.g., the first pixel P1, the second pixel P2, and the third pixel P3) may be selected to be colors of light emitted by the first through third quantum dots. For example, the organic light-emitting diode OLED may emit light having a blue wavelength, the first pixel P1 may realize (e.g., emit) red color, the second pixel P2 may realize (e.g., emit) green color, and the third pixel P3 may realize (e.g., emit) blue color.

Therefore, the first quantum dot 11, the second quantum dot 12, and the third quantum dot 13 may respectively include different materials and/or have different sizes. In some embodiments, the first quantum dot 11, the second quantum dot 12, and the third quantum dot 13 may include a same (e.g., substantially the same) material, but the sizes of the first quantum dot 11, the second quantum dot 12, and the third quantum dot 13 may be different from one another. For example, a size d1 (e.g., a particle size) of the first quantum dot 11 may be greater than a size d2 (e.g., a particle size) of the second quantum dot 12, and the size d2 of the second quantum dot 12 may be greater than a size d3 (e.g., a particle size) of the third quantum dot 13. Embodiments of the present disclosure may satisfy the equation: d1>d2>d3.

As the first quantum dot 11, the second quantum dot 12, and the third quantum dot 13 are provided as a plurality, an average size (e.g., average particle size) of the first quantum dots 11 may be different from an average size (e.g., average particle size) of the second quantum dots 12 and an average size (e.g., average particle size) of the third quantum dots 13.

In some embodiments, the first quantum dot 11, the second quantum dot 12, and the third quantum dot 13 may have CdSe cores. In this case, an average size such as, for example, an average diameter d1 (e.g., average particle diameter) of the core of the first quantum dots 11 may be about 5 nm, an average diameter d2 (e.g., average particle diameter) of the cores of the second quantum dots 12 may be about 3 nm, and an average diameter d3 (e.g., average particle diameter) of the cores of the third quantum dots 13 may be about 1.7 nm.

In some embodiments, the first metal nanoparticle 21, the second metal nanoparticle 22, and the third metal nanoparticle 23 may include a same (e.g., substantially the same) material and have same (e.g., substantially the same) sizes. Light emitted from the organic light-emitting diode OLED is applied to the quantum transformation layers (e.g., the first quantum transformation layer QD1, the second quantum transformation layer QD2, and the third quantum transformation layer QD3), and the light emitted from the organic light emitting diode OLED may emit colors having same (e.g., substantially the same) wavelengths. Therefore, in the present embodiment, the first metal nanoparticles 21, the second metal nanoparticles 22, and the third metal nanoparticles 23 may all include a same (e.g., substantially the same) material such that a suitable or most appropriate extinction property is realized to correspond to the wavelength. In addition, an average size of the first metal nanoparticles 21, an average size of the second metal nanoparticles 22, and an average size of the third metal nanoparticles 23 may be identical to one another.

In some embodiments, the wavelength emitted by the organic light-emitting diode OLED is blue light, and the first metal nanoparticles 21, the second metal nanoparticles 22, and the third metal nanoparticles 23 may have average sizes at which a suitable or most appropriate extinction property is realized with respect to the blue light.

A first protection layer 220 may be on (e.g., arranged on) the upper substrate 200 to cover the quantum transformation layers (e.g., the first quantum transformation layer QD1, the second quantum transformation layer QD2, and the third quantum transformation layer QD3). The first protection layer 220 may include an inorganic material such as $SiO_2$, $SiN_x$, SiON, $Al_2O_3$, $TiO_2$, $Ta_2O_5$, $HfO_2$, and/or $ZnO_2$. The first protection layer 220 may include an organic material such as polyimide and/or epoxy.

Color filters (e.g., a first color filter CF1, a second color filter CF2, and a third color filter CF3), and the light blocking pattern 210 may be further provided on the upper substrate 200. The color filters (e.g., the first color filter CF1, the second color filter CF2, and the third color filter CF3) may be adopted for realizing a full color image, enhancing color purity, and enhancing outdoor visibility. The first color filter CF1 may be realized as (or filter) a color identical to a color of light emitted from the first quantum transformation layer QD1, the second color filter CF2 may be realized as (or filter) a color identical to a color of light emitted from the second quantum transformation layer QD2, and the third color filter CF3 may be realized as (or filter) a color identical to a color of light emitted from the third quantum transformation layer QD3.

The light blocking pattern 210 may be arranged between the first color filter CF1, the second color filter CF2, and the third color filter CF3 to correspond to a non-emission area NEA. The light blocking pattern 210, which is a black matrix, may be a member for enhancing color visibility and contrast. The light blocking pattern 210 may include at least one selected from a black pigment, a black dye, and a black particle. In some embodiments, the light blocking pattern 210 may include materials such as Cr, CrOx, Cr/CrOx, Cr/CrOx/CrNy, a resin (a Carbon pigment, an RGB blend material), graphite, and/or a non-Cr based material.

The color filters (e.g., the first color filter CF1, the second color filter CF2, and the third color filter CF3) may be arranged to correspond to the emission area EA in the upper substrate 200, and the second protective layer 230 may be provided to cover the light blocking pattern 210 and the color filters (e.g., the first color filter CF1, the second color filter CF2, and the third color filter CF3).

The second protective layer 230 may include an inorganic material such as $SiO_2$, $SiN_x$, SiON, $Al_2O_3$, $TiO_2$, $Ta_2O_5$, $HfO_2$, and/or $ZnO_2$. The second protective layer 230 may include an organic material such as polyimide and/or epoxy.

A filler 610 may be further arranged between the substrate 100 and the upper substrate 200. The filler 610 may have a buffering function to an external pressure and/or the like. The filler 610 may include an organic material such as methyl silicone, phenyl silicone, and/or polyimide. However, the filler 610 is not limited thereto and may also include an organic sealant such as an urethane-based resin, epoxy-based resin, acryl-based resin, and/or an inorganic sealant such as silicon.

In some embodiments, a condensing member, which may condense light emitted from the organic light-emitting diode OLED, may be further arranged between the filler 610 and the quantum transformation layers (e.g., the first quantum transformation layer QD1, the second quantum transformation layer QD2, and the third quantum transformation layer QD3).

Figure 5:
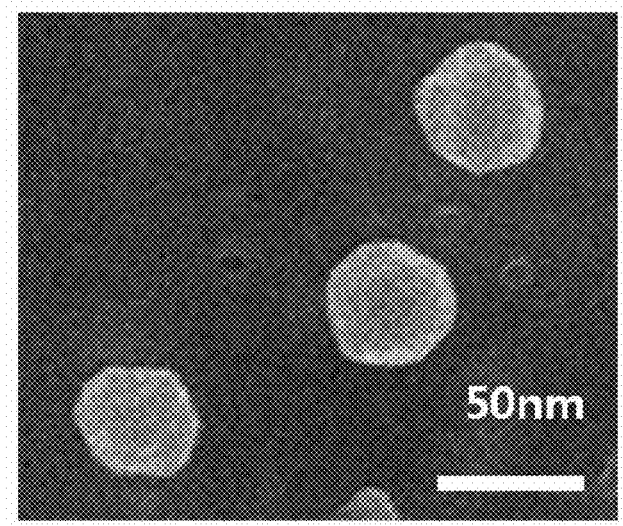
FIG. 5 is a photomicrograph of examples of metal nanoparticles which may be provided in a quantum transformation layer according to an embodiment.
Figure 6:
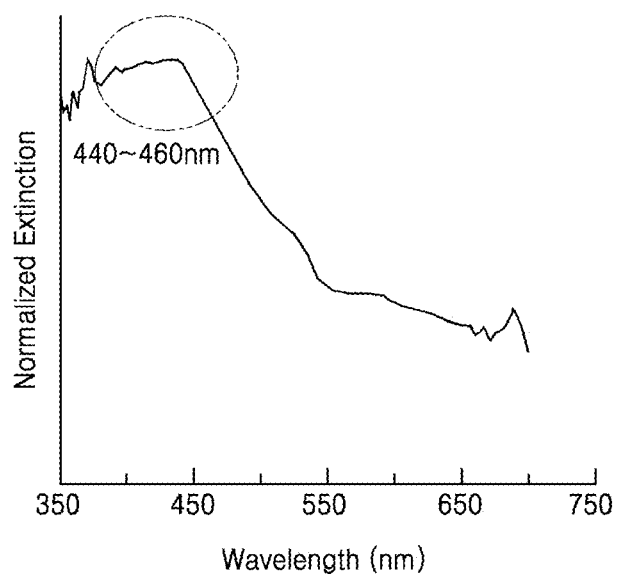
FIG. 6 is a graph of characteristics of photon extinction by metal nanoparticles having sizes shown in FIG. 5, according to wavelength.

FIG. 5 is a photomicrograph of examples of the first metal nanoparticle 21, the second metal nanoparticle 22, and the third metal nanoparticle 23 which may be provided in the first quantum transformation layer QD1, the second quantum transformation layer QD2, and the third quantum transformation layer QD3 according to an embodiment. FIG. 6 is a graph of characteristics of photon extinction by the first metal nanoparticle 21, the second metal nanoparticle 22, and the third metal nanoparticle 23 having sizes shown in FIG. 5, according to wavelengths.

The first metal nanoparticle 21, the second metal nanoparticle 22, and the third metal nanoparticle 23 shown in FIG. 5 include silver (Ag). The first metal nanoparticle 21, the second metal nanoparticle 22, and the third metal nanoparticle 23 are approximately spherical and each have a radius in a range from about 20 nm to about 40 nm. Referring to the graph shown in FIG. 6, light having a wavelength from about 440 nm to about 460 nm shows an increased (e.g., a maximum) extinction characteristic.

In some embodiments, when the light emitted from the organic light-emitting diode OLED is blue light in a range from about 440 nm to about 460 nm, the first metal nanoparticle 21, the second metal nanoparticle 22, and the third metal nanoparticle 23 may include Ag having a radius from about 20 nm to about 40 nm.

Figure 7A:
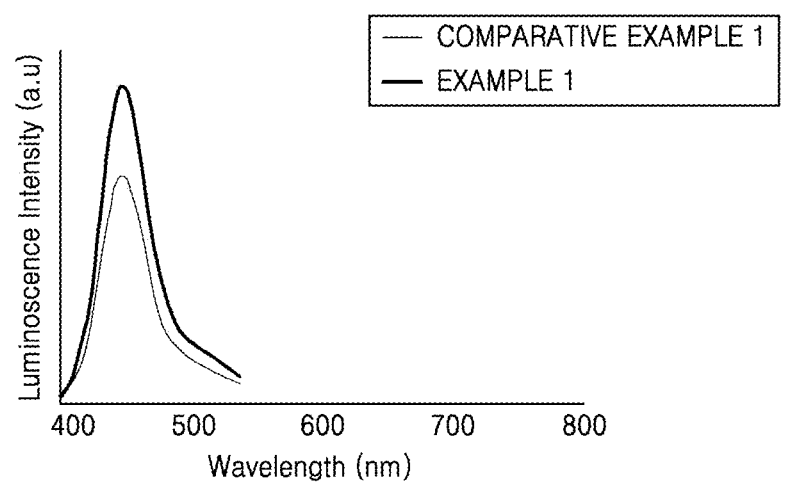
FIG. 7A is a graph showing results of comparing luminance of a quantum transformation layer configured to appear blue according to a comparative example and an embodiment.

FIG. 7A is a graph showing results of comparing luminance of a quantum transformation layer configured to appear blue according to a comparative example and an embodiment. Light having blue color is used as light to be applied to the quantum transformation layer.

Comparative Example 1 shown in the graph is a case in which the quantum dot is designed to include a material and have a size for realizing (e.g., emitting) light having a blue color and do not include metal nanoparticles, and Example 1 is a case in which the quantum dot is designed to include a material and have a size for realizing (e.g., emitting) light having a blue color and include the metal nanoparticles having sizes in a range from about 20 nm to about 40 nm. The size of metal nanoparticle indicates a radius of the metal nanoparticle that is fitted as a sphere.

According to the graph, Example 1 including the metal nanoparticle has a higher luminance peak than in the Comparative Example 1 that does not include the metal nanoparticle.

Figure 7B:
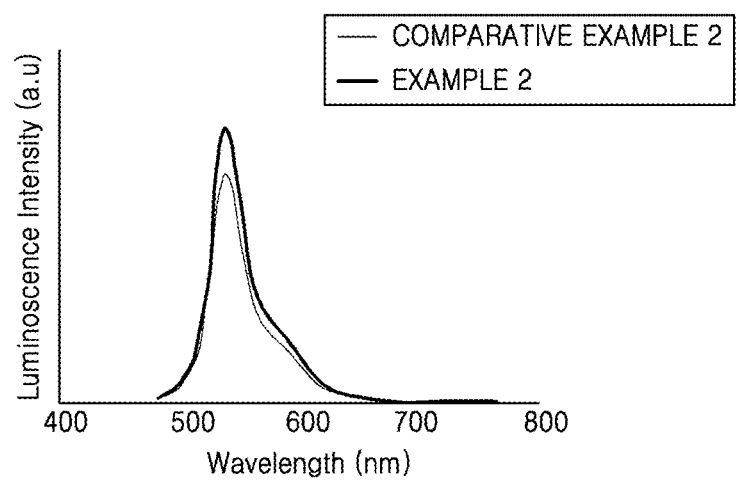
FIG. 7B is a graph showing results of comparing luminance of a quantum transformation layer configured to appear green according to a comparative example and an embodiment.

FIG. 7B is a graph showing results of comparing luminance of a quantum transformation layer configured to appear green according to a comparative example and an embodiment. Light having a blue color is used as light to be applied to the quantum transformation layer.

Comparative Example 2 shown in the graph is a case in which the quantum dot is designed to include a material and have a size for realizing (e.g., emitting) light having a green color and does not include metal nanoparticles, and Example 2 is a case in which the quantum dot is designed to include a material and have a size for realizing (e.g., emitting) light having a green color and includes the metal nanoparticles having sizes in a range from about 20 nm to about 40 nm. The size of metal nanoparticle indicates a radius of the metal nanoparticle that is fitted as a sphere.

According to the graph, Example 2 including the metal nanoparticle has a higher luminance peak than in Comparative Example 2 that does not include the metal nanoparticles.

Figure 7C:
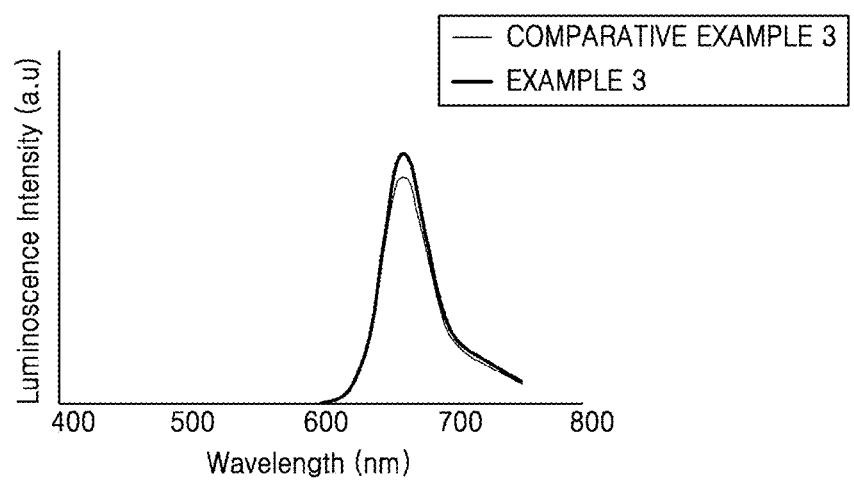
FIG. 7C is a graph showing results of comparing luminance of a quantum transformation layer configured to appear red according to a comparative example and an embodiment.

FIG. 7C is a graph showing results of comparing luminance of a quantum transformation layer configured to appear red according to a comparative example and an embodiment. Light having a blue color is used as light to be applied to the quantum transformation layer.

Comparative Example 3 shown in the graph is a case in which the quantum dot is designed to include a material and have a size for realizing (e.g., emitting) light having a red color and does not include metal nanoparticles, and Example 3 is a case in which the quantum dot is designed to include a material and have a size for realizing (e.g., emitting) light having a red color and includes the metal nanoparticles having sizes in a range from about 20 nm to about 40 nm. The size of metal nanoparticle indicates a radius of the metal nanoparticle that is fitted as a sphere.

According to the graph, Example 3 including the metal nanoparticle has a higher luminance peak than Comparative Example 3 that does not include the metal nanoparticles.

From the results described herein above, it is understood that the luminance of the quantum transformation layer may increase due to the metal nanoparticle. It is also understood that an optimum luminance is realized by selecting the size of metal nanoparticles according to the color of light applied to the quantum transformation layer.

Figure 8:
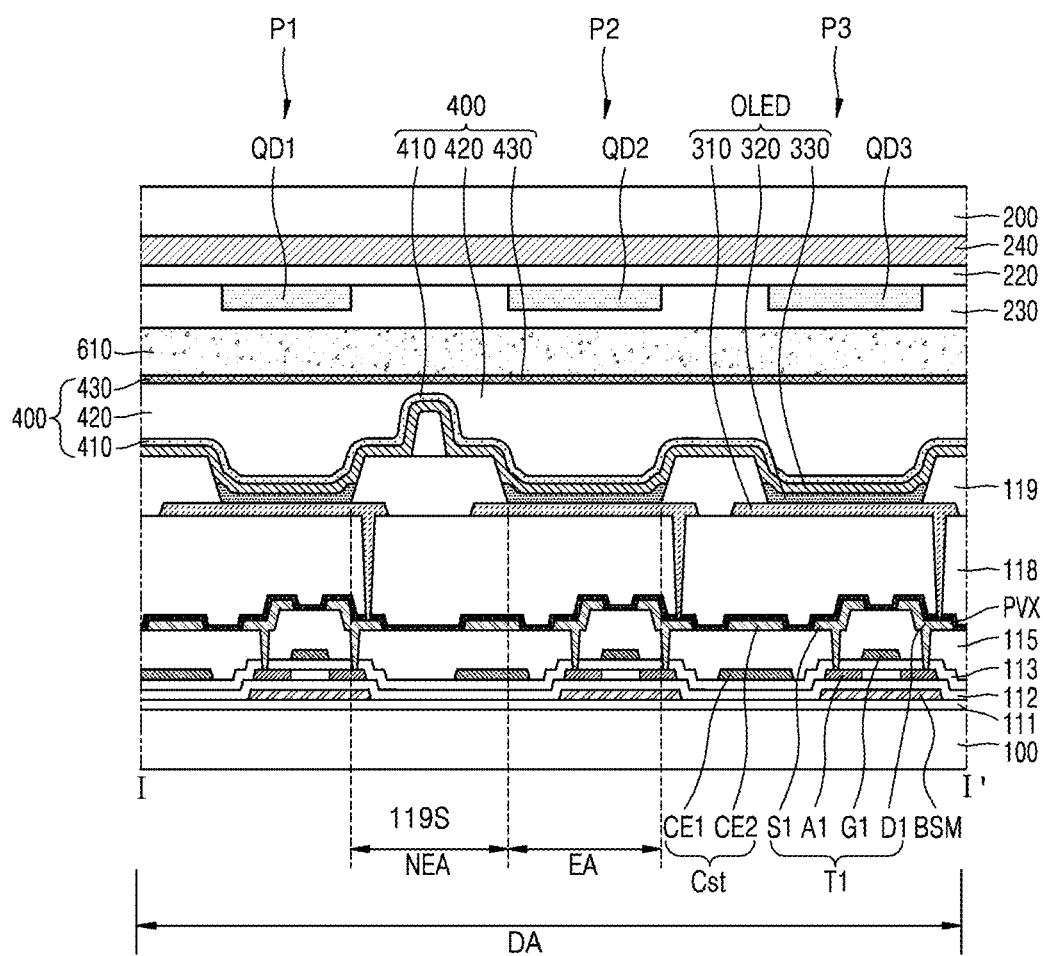
FIG. 8 is a schematic cross-sectional view of a display apparatus according to another embodiment.

FIG. 8 is a schematic cross-sectional view of a display apparatus according to another embodiment. In FIG. 8, same reference numerals as shown in FIG. 3 indicate same members shown in FIG. 3, and therefore, duplicative descriptions thereof will not be repeated here.

Referring to FIG. 8, the display apparatus according to the present embodiment includes the first quantum transformation layer QD1 provided in the first pixel P1, the second quantum transformation layer QD2 provided in the second pixel P2, and the third quantum transformation layer QD3 provided in the third pixel P3. The first quantum transformation layer QD1 includes first quantum dots and first metal nanoparticles, and the second quantum transformation layer QD2 includes second quantum dots and second metal nanoparticles. The third quantum transformation layer QD3 may include third quantum dots and third metal nanoparticles. In this case, an average size (e.g., average particle size) of the first quantum dots is different from an average size (e.g., average particle size) of the second quantum dots, and an average size (e.g., average particle size) of the first metal nanoparticles is identical to an average size (e.g., average particle size) of the second metal nanoparticles.

Organic light-emitting diodes OLEDs included in the first pixel P1, the second pixel P2, and the third pixel P3 may all emit light of a same (e.g., substantially the same) color. For example, the organic light-emitting diodes OLEDs may emit blue light. Accordingly, the first through metal nanoparticles may each have a size having an increased (e.g., a maximum) extinction property under blue light. In some embodiments, the first through third metal nanoparticles may each include Ag and have a radius in a range from about 20 nm to about 40 nm.

In some embodiments, the first quantum transformation layer QD1 may emit red light from the first quantum dots; and the second quantum transformation layer QD2 may emit green light from the second quantum dots. The third quantum transformation layer QD3 may emit blue light from the third quantum dots. In this case, the average size of the first quantum dots may be greater than the average size of the second quantum dots. The average size of the second quantum dots may be greater than the average size of the third quantum dots. For example, as the quantum transformation represents a color having a longer wavelength, the quantum dots included in the quantum transformation layer may have greater sizes.

In the present embodiment, a polarization layer 240 may be arranged instead of the color filters (e.g., the first color filter CF1, the second color filter CF2, and the third color filter CF3; see FIG. 3) between the quantum transformation layers (e.g., the first quantum transformation layer QD1, the second quantum transformation layer QD2, and the third quantum transformation layer QD3) and the upper substrate 200. The polarization layer 240 may be deposited on a back surface of the upper substrate 200 or laminated in the form of a polarizing film.

The polarization layer 240 may be adopted for realizing (or to facilitate achieving) a full-color image, improving color purity, and/or improving outdoor visibility.

The polarization layer 240 polarizes light incident from a light source into a light having a direction identical to a direction of a polarizing axis. In some embodiments, the polarization layer 240 may include a polarizer and/or a dichroic dye in a poly vinyl alcohol (PVA) film. The dichroic dye may include iodine molecules and/or dye molecules.

In some embodiments, the polarization layer 240 may be formed by stretching the PVA film in one direction and immersing the PVA film in a solution of iodine and/or dichroic dye. In this case, the iodine molecules and/or dichroic dye molecules are aligned in parallel (e.g., substantially in parallel) along a stretching direction (the one direction). The iodine molecules and the dye molecules that are dichroic may absorb light vibrating in the stretching direction and transmit light vibrating in a direction perpendicular (e.g., substantially perpendicular) to the stretching direction.

Various suitable functional layers for preventing (or reducing) permeation of outdoor air, including moisture, into the polarization layer 240 or complementing mechanical strength may be further arranged above and/or under the polarization layer 240. The functional layer may include one (or more) selected from PVA, poly vinylidene chloride (PVDC), ethylene vinyl alcohol (EVOH), cyclo olefin polymer (COP), and tri-acetyl cellulose (TAC). The functional layer may include a plurality of layers. In some embodiments, the functional layer and the polarization layer 240 may adhere to each other by an adhesion member.

FIGS. 9 and 10 are schematic cross-sectional views of display apparatuses according to other embodiments. In FIGS. 9 and 10, the same reference numerals as those shown in FIG. 3 indicate the same members as shown in FIG. 3, and therefore, duplicative descriptions thereof will not be repeated here.

Referring to FIGS. 9 and 10, the display apparatuses according to the present embodiments include the first quantum transformation layer QD1 provided in the first pixel P1, the second quantum transformation layer QD2 provided in the second pixel P2, and the third quantum transformation layer QD3 provided in the third pixel P3. The first quantum transformation layer QD1 includes first quantum dots and first metal nanoparticles, and the second quantum transformation layer QD2 includes second quantum dots and second metal nanoparticles. The third quantum transformation layer QD3 may include third quantum dots and third metal nanoparticles. In this case, an average size (e.g., average particle size) of the first quantum dots is different from an average size (e.g., average particle size) of the second quantum dots, and an average size (e.g., average particle size) of the first metal nanoparticles is identical to an average size (e.g., average particle size) of the second metal nanoparticles.

Organic light-emitting diodes OLEDs included in the first pixel P1, the second pixel P2, and the third pixel P3 may all emit light of a same (e.g., substantially the same) color. For example, the organic light-emitting diodes OLEDs may emit blue light. Accordingly, the first through metal nanoparticles may each have a size (e.g., a particle size) having an increased (e.g., a maximum) extinction property under blue light. In some embodiments, the first through third metal nanoparticles may each include Ag and have a radius from about 20 nm to about 40 nm.

In some embodiments, the first quantum transformation layer QD1 may emit red light from the first quantum dots 11 and the second quantum transformation layer QD2 may emit green light from second quantum dots 12. The third quantum transformation layer QD3 may emit blue light from the third quantum dots. In this case, the average size of the first quantum dots may be greater than the average size of the second quantum dots. The average size of the second quantum dots may be greater than the average size of the third quantum dots. For example, as the quantum transformation represents a color having a longer wavelength, the quantum dots included in the quantum transformation layer may have greater sizes.

In the embodiment of FIG. 10, a touch-screen layer 700 may be arranged above the thin film encapsulation layer 400.

For example, the touch-screen layer 700 may use a capacitance method. In the capacitance method, change occurs in a mutual capacitance generated between touch electrodes 710 of the touch-screen layer 700 when a cover layer is touched, and the touch-screen layer 700 may determine whether the touch electrodes 710 are in contact (e.g., electrical contact) with each other by detecting the change in the mutual capacitance. In some embodiments, the touch-screen layer 700 may determine contacts according to various suitable methods. For example, a change in a capacitance may occur between the touch electrodes 710 and the opposite electrode 330, and the touch-screen layer 700 may determine whether the touch electrodes 710 and the opposite electrode 330 were in contact (e.g., electrical contact) by detecting the change in the capacitance.

According to the embodiment of FIG. 10, the touch-screen layer 700 may have a structure in which a first touch conductive layer 711, a first insulating layer 712, a second touch conductive layer 713, and a second insulating layer 714 are sequentially stacked. The touch electrode 710 may include the first touch conductive layer 711 and the second touch conductive layer 713.

In some embodiments, both the first touch conductive layer 711 and the second touch conductive layer 713 may function as sensors. For example, the first insulating layer 712 may include a via hole that exposes an upper surface of the first touch conductive layer 711, and the first touch conductive layer 711 and the second touch conductive layer 713 may be coupled to each other through the via hole. As described herein above, by using the first touch conductive layer 711 and the second touch conductive layer 713, a resistance of the touch electrode 710 may decrease and a response speed of the touch-screen layer 700 may be enhanced.

In some embodiments, the touch electrode 710 may include a mesh structure such that light emitted from the organic light-emitting diode passes through the touch electrode 710. Accordingly, the first touch conductive layer 711 and the second touch conductive layer 713 of the touch electrode 710 may be arranged not to overlap an emission area of the organic light-emitting diode OLED.

The first touch conductive layer 711 and the second touch conductive layer 713 may each include a single layer or multiple layers including a conductive material with extraordinary conductivity (e.g., electrical conductivity or extraordinary electrical conductivity). For example, the first touch conductive layer 711 and the second touch conductive layer 713 may each include a single layer or multiple layers including a conductive material that includes a transparent conductive layer, Al, Cu, Ti, and/or the like. The transparent conductive layer may include a transparent conductive oxide such as indium tin oxide (ITO), indium zinc oxide (IZO), zinc oxide (ZnO), and/or indium tin zinc oxide (ITZO). In addition, the transparent conductive layer may include a conductive polymer such as PEDOT, a metal nano wire, graphene, and/or the like. In some embodiments, the first touch conductive layer 711 and the second touch conductive layer 713 may each have a stack structure including Ti/Al/Ti.

The first insulating layer 712 and the second insulating layer 714 may each include an inorganic material or an organic material. The inorganic material may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one selected from an acrylic resin, methacrylic resin, polyisoprene, vinyl-based resin, epoxy-based resin, urethane-based resin, cellulose-based resin, and phenylene-based resin.

In some embodiments, a touch buffer layer may be further provided between the thin film encapsulation layer 400 and the touch-screen layer 700. The touch buffer layer may prevent (or reduce) damage to the thin film encapsulation layer 400 and interrupt an interference signal that may be generated when the touch-screen layer 700 is driven. The touch buffer layer may include an inorganic material such as silicon oxide, silicon nitride, silicon oxynitride, aluminum oxide, aluminum nitride, titanium oxide, and/or titanium nitride, and/or an organic material such as polyimide, polyester, and/or acryl, and may include a stack structure including at least two selected from the above-mentioned materials.

As the touch buffer layer and/or the touch-screen layer 700 is directly formed on the thin film encapsulation layer 400 by deposition and/or the like, an adhesion layer is not required on the thin film encapsulation layer 400. Therefore, a thickness of the display apparatus may be reduced.

According to another embodiment, the touch-screen layer 700 may be formed not on the thin film encapsulation layer 400 but on the upper substrate 200. Various suitable modifications may be made to the display apparatus. For example, instead of the touch-screen layer 700, a touch panel may be attached to the top of upper substrate 200 by the adhesion layer.

Example embodiments have been described herein. The embodiments may be realized in individual embodiments or combinations of embodiments.

As described herein above, the display apparatus according to embodiments of the present disclosure includes the quantum transformation layer, which includes the quantum dots and metal nanoparticles, and may realize high quality images.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display apparatus comprising:
   a first pixel, a second pixel, and a third pixel respectively configured to emit different colors;
   a first quantum transformation layer arranged to correspond to an emission area of the first pixel, the first quantum transformation layer comprising first quantum dots and first metal nanoparticles; and a second quantum transformation layer arranged to correspond to an emission area of the second pixel, the second quantum transformation layer comprising second quantum dots and second metal nanoparticles,
   wherein the first quantum dots have sizes in a range that is different from a range of sizes of the second quantum dots, and
   wherein the first metal nanoparticles have sizes in a range that is identical to a range of sizes of the second metal nanoparticles.

2. The display apparatus of claim 1, further comprising:
   a first color filter arranged to correspond to the first pixel, a second color filter arranged to correspond to the second pixel, and a third color filter arranged to correspond to the third pixel, wherein the first color filter, the second color filter, and the third color filter are configured to filter colors that are different from each other.

3. The display apparatus of claim 1, further comprising:
an upper substrate arranged to correspond to a substrate, wherein the upper substrate comprises a polarization layer.

4. The display apparatus of claim 1, further comprising:
a thin-film encapsulation layer covering the first pixel, the second pixel, and the third pixel, the thin-film encapsulation layer comprising at least one inorganic encapsulation layer and at least one organic encapsulation layer; and
a touch-screen layer on the thin-film encapsulation layer.

5. The display apparatus of claim 1, wherein:
the first pixel is configured to emit a color having a longer wavelength than a wavelength of a color emitted by the second pixel, and
an average size of the first quantum dots is greater than an average size of the second quantum dots.

6. The display apparatus of claim 1, wherein:
the first metal nanoparticles and the second metal nanoparticles are curved and do not have angles.

7. The display apparatus of claim 1, wherein:
the first metal nanoparticles and the first quantum dots are spaced apart from one another, and
the second metal nanoparticles and the second quantum dots are spaced apart from one another.

8. The display apparatus of claim 1, further comprising:
graft molecules on surfaces of the first metal nanoparticles and on surfaces of the second metal nanoparticles.

9. The display apparatus of claim 1, wherein:
the first metal nanoparticles and the second metal nanoparticles comprise any one selected from gold (Au), silver (Ag), aluminum (Al), alumina ($Al_2O_3$), cobalt (Co), copper (Cu), chromium (Cr), platinum (Pt), nickel (Ni), iron (Fe), molybdenum (Mo), and tungsten (W).

10. The display apparatus of claim 1, wherein:
respective radiuses of the first metal nanoparticles and the second metal nanoparticles are in a range from about 20 nm to about 40 nm.

11. The display apparatus of claim 1, comprising:
a third quantum transformation layer arranged to correspond to the third pixel, the third quantum transformation layer comprising third quantum dots and third metal nanoparticles,
wherein an average size of the third quantum dots is different from an average size of the first quantum dots and an average size of the second quantum dots, or
wherein an average size of the third metal nanoparticles is identical to an average size of the first metal nanoparticles and an average size of the second metal nanoparticles.

12. The display apparatus of claim 1, wherein:
the first pixel, the second pixel, and the third pixel respectively comprise organic light-emitting diodes.

13. The display apparatus of claim 12, wherein:
the organic light-emitting diodes included in the first pixel, the second pixel, and the third pixel are all configured to emit blue light.

14. A display apparatus comprising:
a first pixel, a second pixel, and a third pixel each comprising an organic light-emitting diode configured to emit blue light;
a thin-film encapsulation layer covering the organic light-emitting diode; and
a first quantum transformation layer on the thin-film encapsulation layer and corresponding to the first pixel, a second quantum transformation layer corresponding to the second pixel, and a transmission window corresponding to the third pixel,
wherein the first quantum transformation layer comprises first quantum dots and first metal nanoparticles, and
wherein the second quantum transformation layer comprises second quantum dots having an average size different from an average size of the first quantum dots, and second metal nanoparticles having an average size that is identical to an average size of the first metal nanoparticles.

15. The display apparatus of claim 14, wherein:
the organic light-emitting diodes included in the first pixel, the second pixel, and the third pixel are configured to emit blue light.

16. The display apparatus of claim 14, wherein:
the thin-film encapsulation layer comprises at least one inorganic encapsulation layer and at least one organic encapsulation layer.

17. The display apparatus of claim 14, wherein:
the first metal nanoparticles and the second nanoparticles comprise silver (Au) and each have a radius in a range of about 20 nm to about 40 nm.

18. The display apparatus of claim 14, wherein:
the transmission window comprises scattering particles.

19. The display apparatus of claim 14, further comprising:
a touch conductive layer on the thin-film encapsulation layer.

20. The display apparatus of claim 14, further comprising:
a first color filter arranged to correspond to the first quantum transformation layer;
a second color filter arranged to correspond to the second quantum transformation layer; and
a third color filter arranged to correspond to the transmission window.

* * * * *